(12) United States Patent
Takeda (10) Patent No.: US 10,969,868 B2
(45) Date of Patent: Apr. 6, 2021

(54) TACTILE SENSATION PROVIDING APPARATUS

(71) Applicant: KYOCERA Corporation, Kyoto (JP)

(72) Inventor: Jun Takeda, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/464,644

(22) PCT Filed: Nov. 10, 2017

(86) PCT No.: PCT/JP2017/040625
§ 371 (c)(1),
(2) Date: May 28, 2019

(87) PCT Pub. No.: WO2018/096956
PCT Pub. Date: May 31, 2018

(65) Prior Publication Data
US 2019/0377414 A1 Dec. 12, 2019

(30) Foreign Application Priority Data
Nov. 28, 2016 (JP) .............................. JP2016-230465

(51) Int. Cl.
*H04B 3/36* (2006.01)
*G06F 3/01* (2006.01)
*G06F 3/041* (2006.01)
*H01L 41/09* (2006.01)

(52) U.S. Cl.
CPC ............ *G06F 3/016* (2013.01); *G06F 3/0414* (2013.01); *G06F 3/0416* (2013.01); *H01L 41/09* (2013.01); *G06F 2203/04105* (2013.01); *H03K 2217/96062* (2013.01)

(58) Field of Classification Search
None
See application file for complete search history.

(56) References Cited

U.S. PATENT DOCUMENTS

| 9,046,947 B2 | 6/2015 | Takeda et al. |
| 9,261,896 B2 | 2/2016 | Seki et al. |
| 10,353,469 B2 | 7/2019 | Nakao |
| 2001/0028361 A1* | 10/2001 | Culver ................ G06F 3/03543 715/701 |
| 2004/0233161 A1* | 11/2004 | Shahoian ................ G06F 3/016 345/156 |
| 2009/0073120 A1* | 3/2009 | Yu ........................... G06F 3/016 345/161 |
| 2013/0082829 A1* | 4/2013 | Seki ....................... G05G 9/047 340/407.1 |
| 2013/0215080 A1 | 8/2013 | Takeda et al. |

(Continued)

FOREIGN PATENT DOCUMENTS

| EP | 3 220 232 A1 | 9/2017 |
| JP | 2013080327 A | 5/2013 |
| JP | 2013225173 A | 10/2013 |

(Continued)

*Primary Examiner* — Julie B Lieu
(74) *Attorney, Agent, or Firm* — Studebaker & Brackett PC (57) ABSTRACT

A tactile sensation providing apparatus includes an actuator that vibrates a vibration target and a holding member that holds the vibration target. The holding member is disposed apart from the actuator. The actuator rotates the vibration target with the holding member as a fulcrum.

15 Claims, 6 Drawing Sheets

(56) References Cited

U.S. PATENT DOCUMENTS

2017/0315617 A1    11/2017  Nakao
2019/0344170 A1*   11/2019  Schmitz ................ G06F 3/0338

FOREIGN PATENT DOCUMENTS

| JP | 5452729 B2 | 3/2014 |
| JP | 2016095549 A | 5/2016 |
| WO | 2016/075935 A1 | 5/2016 |

* cited by examiner

TACTILE SENSATION PROVIDING APPARATUS

CROSS-REFERENCE TO RELATED APPLICATION

The present application claims priority to and the benefit of Japanese Patent Application No. 2016-230465 filed Nov. 28, 2016, the entire contents of which are incorporated herein by reference.

TECHNICAL FIELD

The present disclosure relates to a tactile sensation providing apparatus.

BACKGROUND

An actuator that generates vibration has been provided in a touch sensor or the like. The actuator is, for example, a unimorph. The actuator vibrates a vibration target, such as a touch sensor, thereby providing a tactile sensation to a user who touches the vibration target.

SUMMARY

A tactile sensation providing apparatus according to an embodiment of the present disclosure includes an actuator configured to vibrate a vibration target and a holding member configured to hold the vibration target. The holding member is disposed apart from the actuator. The actuator rotates the vibration target with the holding member as a fulcrum.

DETAILED DESCRIPTION

A tactile sensation providing apparatus 10 (see FIG. 1) according to the present disclosure may be provided in various devices. The tactile sensation providing apparatus 10 may be provided in an in-vehicle device, such as a car navigation system or air conditioning system. The tactile sensation providing apparatus 10 may be a switch or the like for operating an in-vehicle device. The tactile sensation providing apparatus 10 may also be provided in a mobile phone, a smartphone, a tablet personal computer (PC), a notebook PC, or the like. The tactile sensation providing apparatus 10 is not limited to these examples and may be provided in any of a variety of electronic devices, such as a desktop PC, a household appliance, an industrial device or factory automation (FA) device, a dedicated terminal, or the like. The drawings referred to below are schematic illustrations. The dimensional ratios and the like in the drawings do not necessarily match the actual dimensions.

The tactile sensation providing apparatus 10 needs to vibrate a vibration target 40 (see FIG. 1) greatly to provide a sufficient tactile sensation to the user. To vibrate the vibration target 40 greatly, the vibration generated by an actuator 20 (see FIG. 1) needs to be transmitted efficiently to the vibration target 40 while the vibration is increased.

Figure 1:
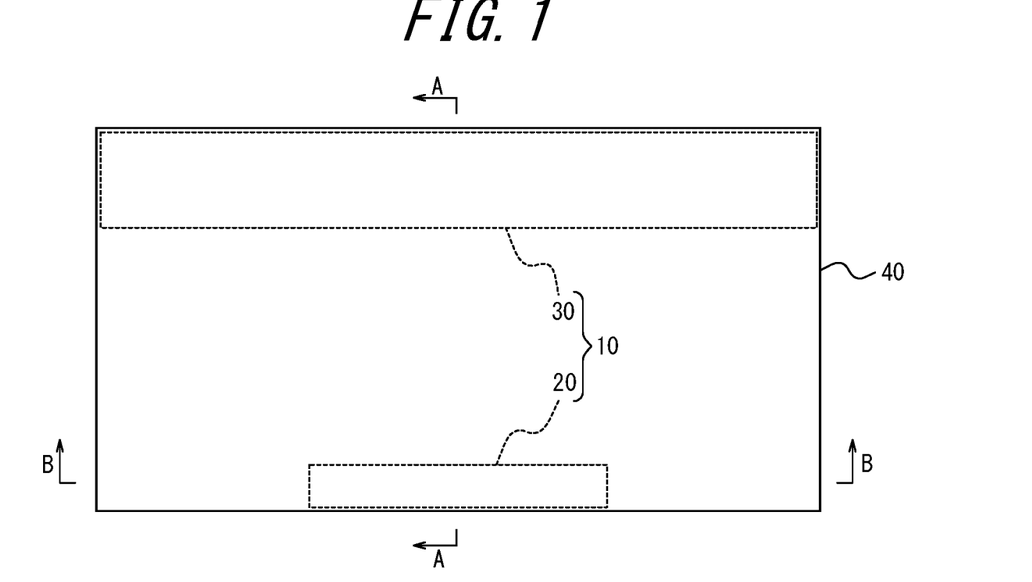
FIG. 1 is a plan view of an example configuration of a tactile sensation providing apparatus according to an embodiment.
Figure 2:
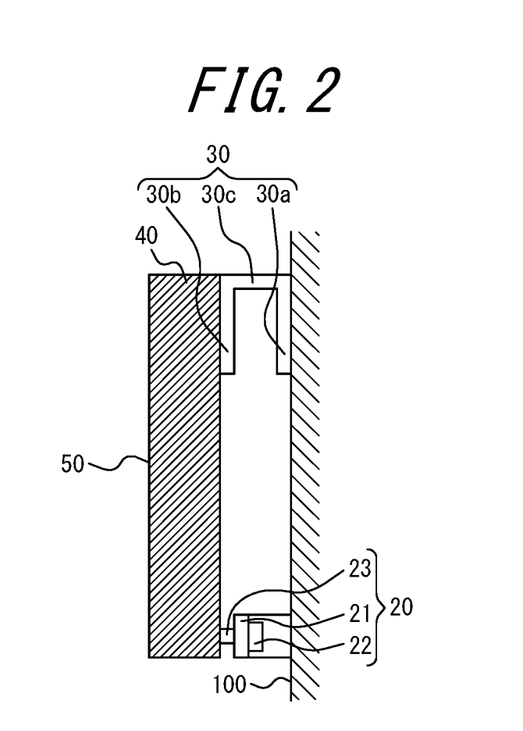
FIG. 2 is a cross-section along the A-A line in FIG. 1.
Figure 3:
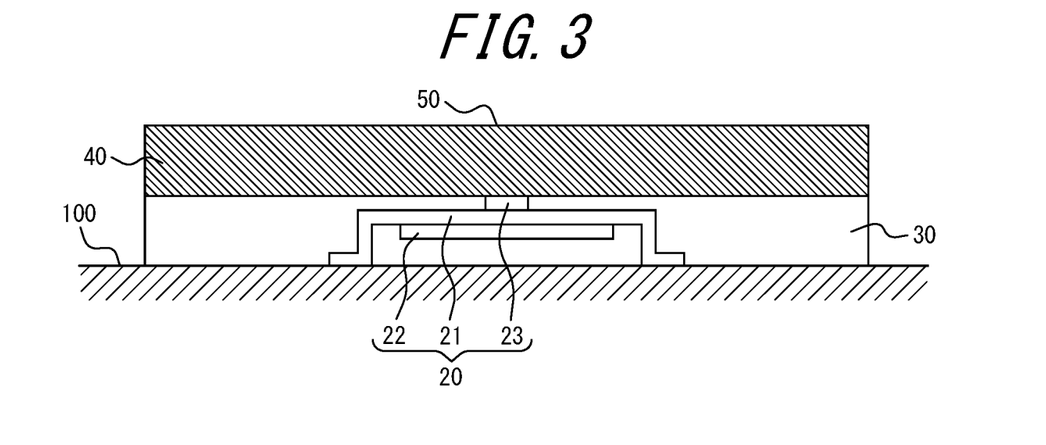
FIG. 3 is a cross-section along the B-B line in FIG. 1.

As illustrated in FIG. 1, FIG. 2, and FIG. 3, the tactile sensation providing apparatus 10 according to an embodiment includes the actuator 20 and a holding member 30. The actuator 20 may be positioned between the vibration target 40 and an attachment target 100. The holding member 30 may be attached to the attachment target 100 and hold the vibration target 40. The actuator 20 may be positioned in a region near an edge of the vibration target 40. The holding member 30 may be positioned in a region near the opposite edge from the edge where the actuator 20 is positioned. The holding member 30 may be disposed apart from the actuator 20.

The attachment target 100 may, for example, be a housing or the like of the device in which the tactile sensation providing apparatus 10 is provided. The surface of the attachment target 100 is assumed to be flat. The surface of the attachment target 100 is not limited to being a flat surface and may be a curved surface or may include a plurality of flat surfaces. The attachment target 100 may be formed integrally or may be a collection of a plurality of housings or the like.

The vibration target 40 may, for example, be an operation panel or the like of the device in which the tactile sensation providing apparatus 10 is provided. The vibration target 40 may be a display panel, such as a liquid crystal display (LCD) or an organic electro luminescence (EL) or inorganic EL display. The vibration target 40 may be a touch panel in which a touch sensor is combined with a display panel. The vibration target 40 is assumed to be a rectangular plate. The vibration target 40 is not limited to being rectangular and may be a polygon, a circle, an ellipse, or any other shape delimited by lines, curves, or the like. The vibration target 40 is not limited to being a plate and may be any other shape, such as a column or block. When the vibration target 40 is a plate, the vibration target 40 may have a surface that faces the attachment target 100, a surface opposite the attachment target 100, and side surfaces.

The vibration target 40 may include an operation interface 50 on the surface opposite the attachment target 100. The operation interface 50 may, for example, include a touch sensor, switches, or the like. By vibrating the vibration target 40 and the operation interface 50 with the actuator 20, the tactile sensation providing apparatus 10 can provide a tactile sensation to a user touching the operation interface 50.

Figure 4:
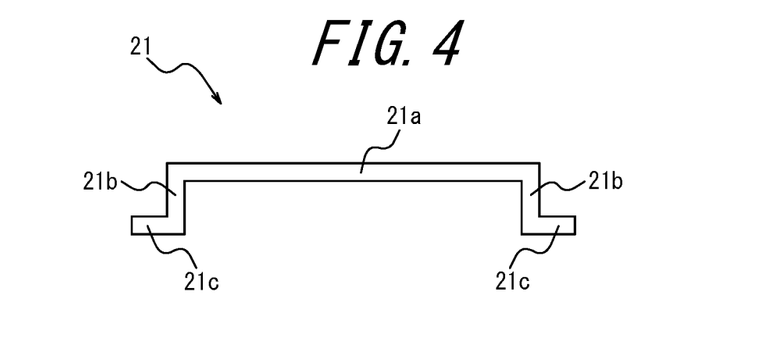
FIG. 4 illustrates the components of the frame illustrated in FIG. 3.

As illustrated in FIG. 2 and FIG. 3, the actuator 20 includes a frame 21, a piezoelectric element 22, and an action part 23. The frame 21 may include a vibration part 21a, supports 21b, and fixing parts 21c, as illustrated in FIG. 4. The actuator 20 may be attached to the attachment target 100 at the fixing parts 21c of the frame 21. The actuator 20 may be attached to the vibration target 40 at the action part 23. The actuator 20 may be attached so that the vibration part 21a extends alongside the surface of the vibration target 40 that faces the attachment target 100. The actuator 20 may be attached to the attachment target 100 and the vibration target 40 by adhesion or the like.

The vibration part 21a may be a rectangular plate-shaped member having a predetermined thickness. The vibration part 21a may, for example, be a thin plate with elasticity. The vibration part 21a may, for example, be configured as metal, resin, or a composite material of metal, resin, and the like. The vibration part 21a may be a thin metal plate. A thin metal plate is also referred to as a shim.

The supports 21b may be positioned at the ends in the longitudinal direction of the vibration part 21a. The supports 21b may, for example, be thin plates with elasticity like the vibration part 21a. The supports 21b may be positioned at predetermined angles relative to the vibration part 21a. The supports 21b may be positioned at right angles or substantially right angles relative to the vibration part 21a. The supports 21b may be configured as the same or different material as the vibration part 21a.

One end of each support 21b may be connected to the vibration part 21a. The other end of each support 21b may be connected to one of the fixing parts 21c. The fixing parts 21c may have a shape conforming to the surface of the attachment target 100. The fixing parts 21c may, for example, be fixed to the attachment target 100 by screwing, adhesion, or the like. The fixing parts 21c may, for example, be thin plates with elasticity like the vibration part 21a. The fixing parts 21c may be made of the same or different material as the vibration part 21a or the supports 21b.

The vibration part 21a, the supports 21b, and the fixing parts 21c may be integrally molded as the frame 21. At least one of the vibration part 21a, the supports 21b, and the fixing parts 21c may be molded separately and assembled as the frame 21. The frame 21 may, for example, be integrally molded by subjecting a thin sheet of metal to sheet-metal processing to bend the thin sheet. The frame 21 may be integrally molded by welding the vibration part 21a, the supports 21b, and the fixing parts 21c together. The frame 21 may be made by integrally molding resin.

The piezoelectric element 22 has, for example, a rectangular shape with a longitudinal direction. The piezoelectric element 22 may expand and contract in the longitudinal direction in a variety of patterns in accordance with an applied voltage signal. The piezoelectric element 22 may be a piezoelectric film or piezoelectric ceramic. Piezoelectric ceramic can generate vibration having a greater vibration energy than piezoelectric film can.

The piezoelectric element 22 may be replaced with a magnetostrictor. A magnetostrictor may expand and contract in accordance with the applied magnetic field. A magnetostrictor may be used together with a coil or the like that converts an applied voltage signal to a magnetic field.

The piezoelectric element 22 may be provided on the surface of the vibration part 21a that faces the attachment target 100. The piezoelectric element 22 may be provided so that the longitudinal direction of the piezoelectric element 22 matches the longitudinal direction of the vibration part 21a.

The action part 23 may be provided near the center, in the longitudinal direction, of the surface of the vibration part 21a that faces the vibration target 40. The action part 23 may connect the vibration part 21a and the vibration target 40. The action part 23 may, for example, be configured as a rubber material. The action part 23 is not limited to a rubber material and may be configured as another material, such as metal. The action part 23 may be joined to the vibration part 21a and the vibration target 40 by adhesion, for example.

Figure 5:
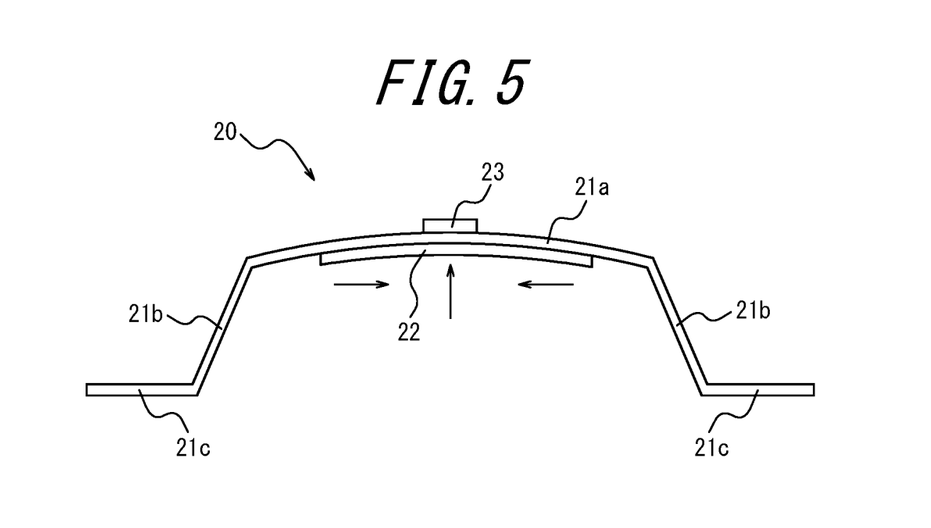
FIG. 5 illustrates an operation example of the actuator of FIG. 3.

A structure in which the piezoelectric element 22 is provided on one surface of the vibration part 21a is also known as unimorph. In a unimorph, the expansion and contraction of the piezoelectric element 22 may provoke bending vibration of the vibration part 21a. When the piezoelectric element 22 contracts, for example as illustrated in FIG. 5, the vibration part 21a can bend so that the side to which the action part 23 is attached becomes convex. When the piezoelectric element 22 expands, unlike the case illustrated in FIG. 5, the vibration part 21a can bend so that the side to which the piezoelectric element 22 is attached becomes convex. When both ends of the vibration part 21a are attached to the attachment target 100 by the supports 21b and the fixing parts 21c, the vibration part 21a can vibrate, in accordance with expansion and contraction of the piezoelectric element 22, in the normal direction of the surface on which the piezoelectric element 22 is provided. The direction in which the vibration part 21a vibrates is also referred to as the vibration direction of the vibration part 21a. The amplitude of the vibration part 21a can be maximized near the center of the vibration part 21a in the longitudinal direction.

When the amplitude of the vibration part 21a is maximized near the center in the longitudinal direction, the displacement of the action part 23 can be near the maximum. The position at which the action part 23 is provided is not limited to being near the center of the vibration part 21a in the longitudinal direction. The action part 23 may be provided at the portion where the amplitude of the vibration part 21a is maximized. The action part 23 may cause the force due to the vibration of the vibration part 21a to act on the vibration target 40, thereby transmitting vibration to the vibration target 40.

The action part 23 may have a large elastic modulus in the vibration direction of the vibration part 21a. This configuration can efficiently transmit vibration of the vibration part 21a to the vibration target 40. The action part 23 may have a small elastic modulus in a direction intersecting the vibration direction of the vibration part 21a. This configuration can reduce the likelihood of damage to the tactile sensation providing apparatus 10 due to an external force. The elastic modulus is a constant indicating the relationship between an external force acting on a member and the amount of displacement of the member. The product of the amount of displacement and the elastic modulus may become the external force. In other words, the same external force can produce a larger amount of displacement as the elastic modulus is smaller.

The supports 21b can maintain a clearance between the vibration part 21a and the attachment target 100. The supports 21b can make the vibration part 21a that vibrates in accordance with displacement of the piezoelectric element 22 less likely to collide with the attachment target 100.

As illustrated in FIG. 2, the holding member 30 may include a first part 30a, a second part 30b, and a third part 30c. The first part 30a may be attached to the attachment target 100. The second part 30b may be attached to the surface of the vibration target 40 that faces the attachment target 100. The third part 30c may connect the first part 30a and the second part 30b. The holding member 30 may, for example, be a leaf spring that has a bent portion. In this case, the first part 30a and the third part 30c, or the second part 30b and the third part 30c, may be delimited by the bent portion. The cross-sectional shape of the holding member 30 illustrated in FIG. 2 may have bent portions at two locations. The holding member 30 illustrated in FIG. 2 may be considered to have a U-shaped cross-section. The holding member 30 may, for example, be configured as rubber, resin, metal, or ceramic. The first part 30a, the second part 30b, and the third part 30c may be configured integrally as the holding member 30. The first part 30a, the second part 30b, and the third part 30c may be configured separately and assembled as the holding member 30.

Instead of being configured to include the piezoelectric element 22, the actuator 20 may be configured to include an ultrasonic transducer, a vibration motor, an eccentric motor, or the like.

The vibration target 40 may have a greater mass and a higher rigidity than the actuator 20 does. The vibration target 40 may be considered a rigid body. When the vibration target 40 is considered a rigid body, the tactile sensation providing apparatus 10 can provide a tactile sensation more efficiently to the device user who touches the vibration target 40 if the vibration target 40 is vibrated as a whole rather than being caused to undergo bending vibration. Assuming that the attachment target 100 is fixed, the actuator 20 can displace the vibration target 40 relative to the attachment target 100 to vibrate the vibration target 40 as a whole. Such vibration of the vibration target 40 as a whole allows a tactile sensation to be provided to the device user who touches the vibration target 40.

As illustrated in FIG. 1 and FIG. 2, the vibration target 40 may be held by the holding member 30 in a region near an edge. The vibration target 40 may be connected to the attachment target 100 by the actuator 20 at the opposite side from where the vibration target 40 is held by the holding member 30. When the actuator 20 is driven and generates vibration, the vibration target 40 may be displaced relative to the attachment target 100 at the side where the actuator 20 is connected. The vibration target 40 may be configured to hardly be displaced relative to the attachment target 100 at the side held by the holding member 30.

Figure 6:
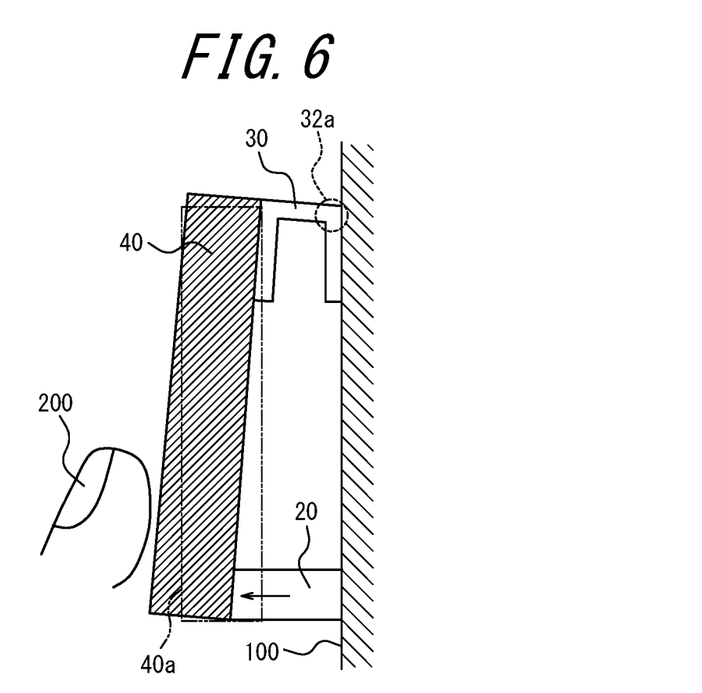
FIG. 6 is a cross-section illustrating an example of rotation of a vibration target.
Figure 7:
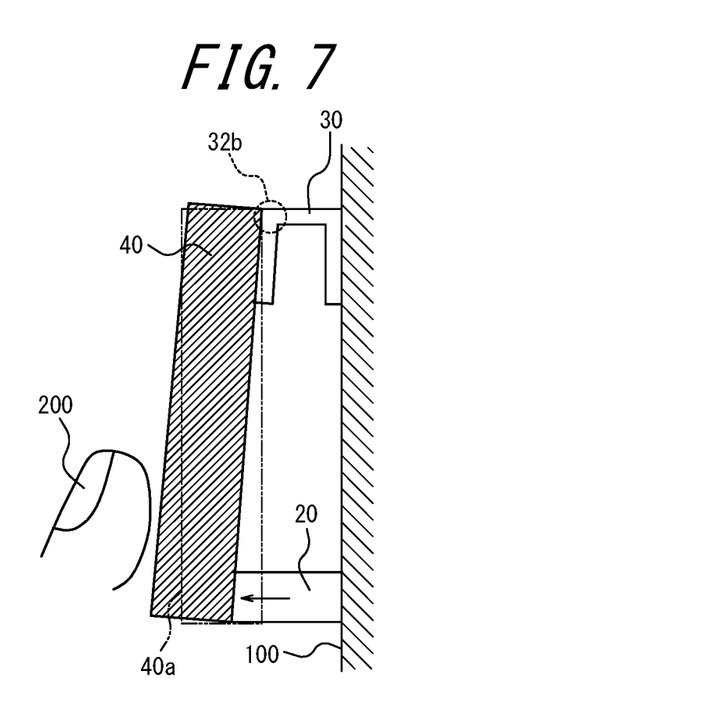
FIG. 7 is a cross-section illustrating an example of rotation of the vibration target.

As illustrated in FIG. 6 and FIG. 7, for example, the vibration target 40 may be displaced by vibration of the actuator 20 in a direction away from the attachment target 100 at the side where the actuator 20 is connected while hardly being displaced at the side held by the holding member 30.

As illustrated in FIG. 6, the vibration target 40 may rotate with a first fulcrum 32a, positioned between the first part 30a and the third part 30c of the holding member 30, as a fulcrum. In this case, the holding member 30 may have a small elastic modulus at the first fulcrum 32a. As illustrated in FIG. 7, the vibration target 40 may rotate with a second fulcrum 32b, positioned between the second part 30b and the third part 30c of the holding member 30, as a fulcrum. In this case, the holding member 30 may have a small elastic modulus at the second fulcrum 32b.

The displacement direction of the vibration target 40 is not limited to being away from the attachment target 100, as in the examples in FIG. 6 and FIG. 7, and may be towards the attachment target 100.

The vibration target 40 may rotate with one or both of the first fulcrum 32a and the second fulcrum 32b as fulcrums. The vibration target 40 can be considered to rotate with the holding member 30 as a fulcrum within a predetermined angular range corresponding to the amplitude of the vibration part 21a of the actuator 20. The predetermined angular range can be set in accordance with the amplitude of the vibration part 21a and the distance from the fulcrum to the action part 23. By causing the vibration target 40 to rotate, the actuator 20 can vibrate the vibration target 40 with a smaller force than when moving the entire vibration target 40 in a translational direction.

In the cross-sections in FIG. 6 and FIG. 7, the fulcrum can be considered to indicate the point where a rotation axis extending in a direction perpendicular to the page intersects the cross-section. In this case, the vibration target 40 can be considered to rotate with the holding member 30 as the rotation axis.

When the vibration target 40 rotates with the holding member 30 as the fulcrum, the force from the action part 23 of the actuator 20 acting on the vibration target 40 can be considered torque applied to the vibration target 40. The torque applied to the vibration target 40 can increase as the distance between the actuator 20 and the holding member 30 is greater. The vibration target 40 can rotate with a smaller force by the holding member 30 being disposed apart from the actuator 20.

A tactile sensation provision target 200 can receive a larger vibration when touching the vibration target 40 on the side where the actuator 20 is disposed than when touching the vibration target 40 on the side where the holding member 30 is disposed. The tactile sensation providing apparatus 10 can provide a greater tactile sensation to the tactile sensation provision target 200 touching the vibration target 40 on the side where the actuator 20 is disposed.

The vibration target 40 can be pressed towards the attachment target 100 as a result of the user operating the operation interface 50. When the vibration target 40 is pressed, the third part 30c of the holding member 30 receives a force in the direction of compression. The displacement of the vibration target 40 can become large when the third part 30c has a small elastic modulus. In this case, the strength of the tactile sensation providing apparatus 10 may decrease. Displacement of the vibration target 40 may make the user feel uncomfortable.

The third part 30c of the holding member 30 may have a large elastic modulus in the direction of compression. This makes the vibration target 40 less prone to displacement towards the attachment target 100 at the time of user operation. Consequently, the tactile sensation providing apparatus 10 has a higher strength with respect to pressing by the user and is less likely to make the user uncomfortable.

When the vibration target 40 is pressed, the supports 21b of the actuator 20 receive a force in the direction of compression. The supports 21b may have a large elastic modulus in the direction of compression. This makes the vibration target 40 less prone to displacement towards the attachment target 100 at the time of user operation. Consequently, the tactile sensation providing apparatus 10 has a higher strength with respect to pressing by the user and is less likely to make the user uncomfortable.

Figure 8:
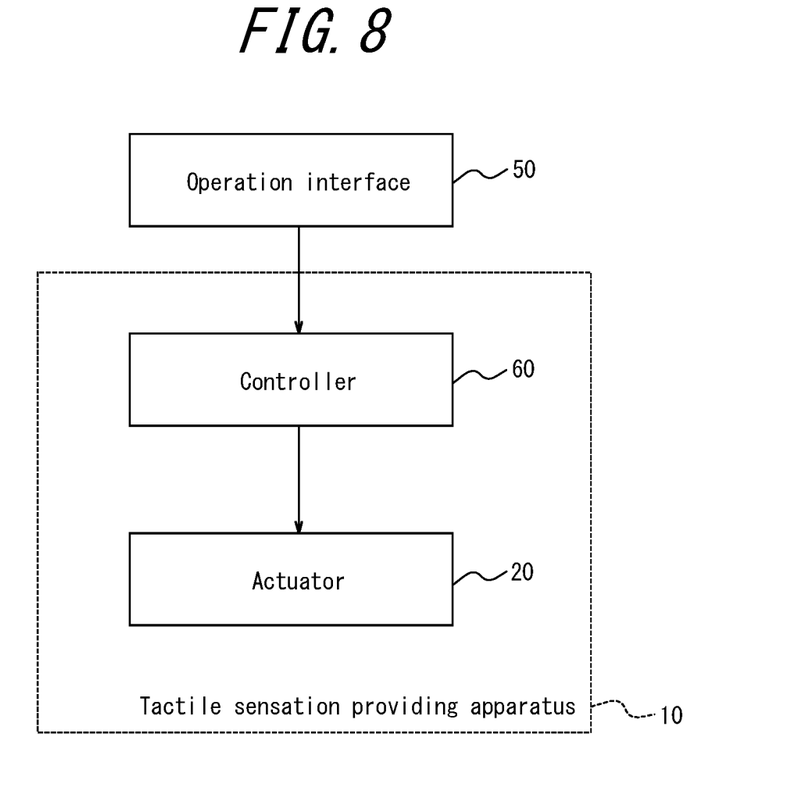
FIG. 8 illustrates an example of the functional blocks of a tactile sensation providing apparatus according to an embodiment.

As illustrated in FIG. 8, the tactile sensation providing apparatus 10 according to an embodiment may further include a controller 60. The controller 60 may be configured as a processor, a microcomputer, or the like capable of executing application software. The term "processor" may encompass universal processors that execute particular functions by reading particular programs and dedicated processors that are specialized for particular processing. Dedicated processors may include an application specific integrated circuit (ASIC). The processor may include a programmable logic device (PLD). The PLD may include a field-programmable gate array (FPGA). The controller 60 may be either a system-on-a-chip (SoC) or a system in a package (SiP) with one processor or a plurality of processors that work together. The controller 60 may appropriately include a storage or the like configured as memory or the like capable of storing various information as necessary.

The controller 60 may be connected to the actuator 20. The controller 60 may output a drive signal to the actuator 20. The drive signal may be a voltage signal that is applied to the piezoelectric element 22 of the actuator 20. The drive signal is not limited to a voltage signal and may be another signal, such as a current signal.

The piezoelectric element 22 may expand and contract in the longitudinal direction in accordance with the drive signal acquired from the controller 60. The vibration part 21a may bend in accordance with displacement of the piezoelectric element 22. The displacement of the piezoelectric element 22 may be converted to vibration of the vibration part 21a. In the case of the drive signal being a voltage signal, for example, the piezoelectric element 22 may be configured either to expand or to contract when positive voltage is applied to the piezoelectric element 22.

In this way, the controller 60 can drive the actuator 20 and vibrate the vibration part 21a. Vibration of the vibration part 21a can be transmitted to the vibration target 40 through the action part 23. A tactile sensation can be provided to the user touching the vibration target 40 by vibration being transmitted to the vibration target 40.

As illustrated in FIG. 8, for example, the controller 60 may be connected to the operation interface 50. The operation interface 50 can detect that the user of the device is touching the vibration target 40. The operation interface 50 may detect that the user of the device is pushing the vibration target 40. In other words, the operation interface 50 may detect that the pressure on the vibration target 40 is equal to or greater than a predetermined pressure. The pressure on the vibration target 40 may, for example, be detected by the actuator 20. The pressure on the vibration target 40 may, for example, be detected by another sensor provided in the vibration target 40. The structure that can detect pressure, including the actuator 20, another sensor, or the like, is also referred to as a pressure detector. The pressure detector may output information pertaining to the detected pressure to the operation interface 50. The operation interface 50 may output the information acquired from the pressure detector to the controller 60. The operation interface 50 may output, to the controller 60, information indicating that the pressure applied to the vibration target 40 is equal to or greater than a predetermined pressure. The controller 60 may acquire the information pertaining to the pressure detected by the pressure detector from the pressure detector or the operation interface 50 and judge whether the pressure is equal to or greater than a predetermined pressure. The controller 60 may output a drive signal to the actuator 20 in accordance with the information acquired from the operation interface 50 or the pressure detector so as to vibrate the vibration target 40 when the user is pushing the vibration target 40. This configuration allows the tactile sensation providing apparatus 10 to provide a tactile sensation to the user pushing the vibration target 40. The operation interface 50 may be provided separately from the vibration target 40.

In the present embodiment, the vibration target 40 may be dustproof when the vibration target 40 is a touch panel in which a display panel is combined with the operation interface 50, for example. When the vibration target 40 is dustproof, dust proofing need not be taken into consideration at and around the portion where the actuator 20 is attached.

The vibration of the actuator 20 is less likely to be obstructed when no member is attached around the actuator 20. Consequently, the vibration generated by the actuator 20 can be increased.

The tactile sensation providing apparatus 10 according to the present embodiment can vibrate the vibration target 40 with a relatively small force by rotating the vibration target 40 with the holding member 30 as a fulcrum. This configuration can efficiently transmit vibration generated by the actuator 20 to the vibration target 40. Consequently, the tactile sensation providing apparatus 10 can provide the user with a sufficient tactile sensation.

Figure 9:
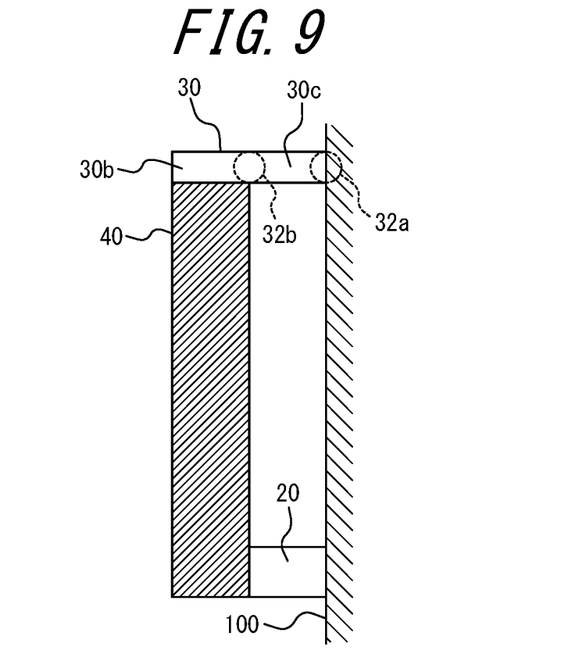
FIG. 9 is a cross-section of a tactile sensation providing apparatus according to another embodiment.

A tactile sensation providing apparatus 10 according to another embodiment may include a holding member 30 like the one illustrated in FIG. 9. The holding member 30 illustrated in FIG. 9 need not include a bent portion. One end face of the holding member 30 may be attached to the attachment target 100. At the other end face, the holding member 30 may hold a side face of the vibration target 40. The holding member 30 can be considered to include a second part 30b that holds the vibration target 40 and a third part 30c that does not hold the vibration target 40. In this case, the holding member 30 may be attached to the attachment target 100 at an end face of the third part 30c. The holding member 30 may be configured so that the vibration target 40 is rotatable with the portion of the holding member 30 attached to the attachment target 100 as a first fulcrum 32a. The holding member 30 may be configured so that the vibration target 40 is rotatable with the boundary between the portion of the holding member 30 that holds the vibration target 40 and the portion that does not as a second fulcrum 32b.

Figure 10:
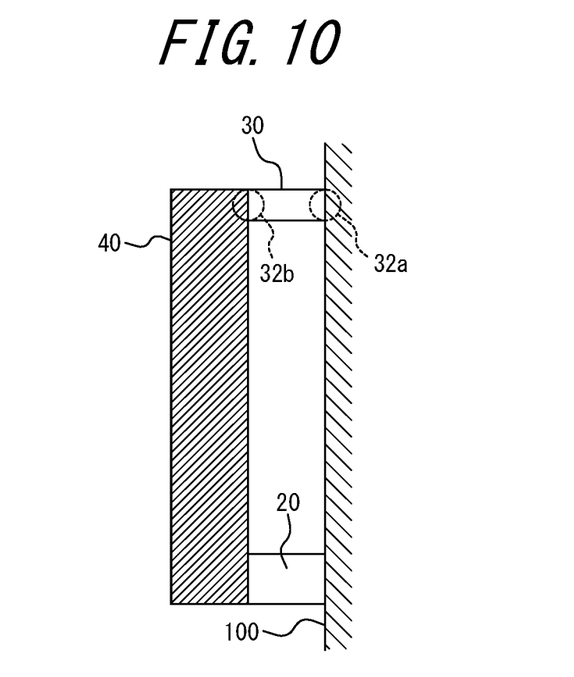
FIG. 10 is a cross-section of a tactile sensation providing apparatus according to another embodiment.

A tactile sensation providing apparatus 10 according to another embodiment may include a holding member 30 like the one illustrated in FIG. 10. The holding member 30 illustrated in FIG. 10 need not include a bent portion. One end face of the holding member 30 may be attached to the attachment target 100. At the other end face, the holding member 30 may hold the surface of the vibration target 40 that faces the attachment target 100. The holding member 30 may be configured so that the vibration target 40 is rotatable with the portion of the holding member 30 attached to the attachment target 100 as a first fulcrum 32a. The holding member 30 may be configured so that the vibration target 40 is rotatable with the portion of the holding member 30 that holds the vibration target 40 as a second fulcrum 32b.

Figure 11:
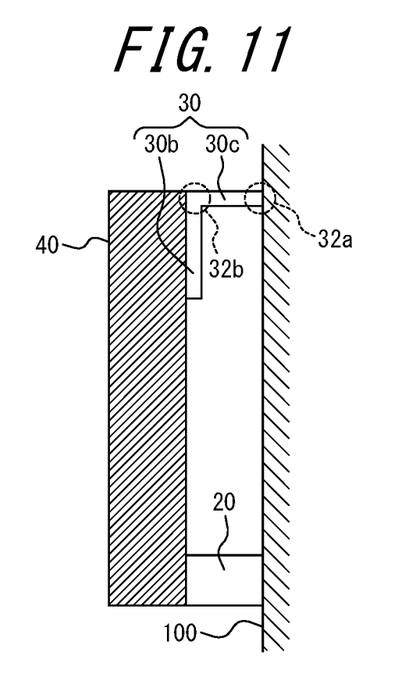
FIG. 11 is a cross-section of a tactile sensation providing apparatus according to another embodiment.

A tactile sensation providing apparatus 10 according to another embodiment may include a holding member 30 like the one illustrated in FIG. 11. The holding member 30 illustrated in FIG. 11 may have one bent portion. The holding member 30 illustrated in FIG. 11 may be considered to have an L-shaped cross-section. The holding member 30 may include a second part 30b and a third part 30c delimited by the bent portion. The holding member 30 may be attached to the attachment target 100 at an end face of the third part 30c. The second part 30b of the holding member 30 may hold the vibration target 40 at the surface of the vibration target 40 that faces the attachment target 100. The holding member 30 may be configured so that the vibration target 40 is rotatable with the portion of the holding member 30 attached to the attachment target 100 as a first fulcrum 32a. The holding member 30 may be configured so that the vibration target 40 is rotatable with the bent portion as a second fulcrum 32b.

Figure 12:
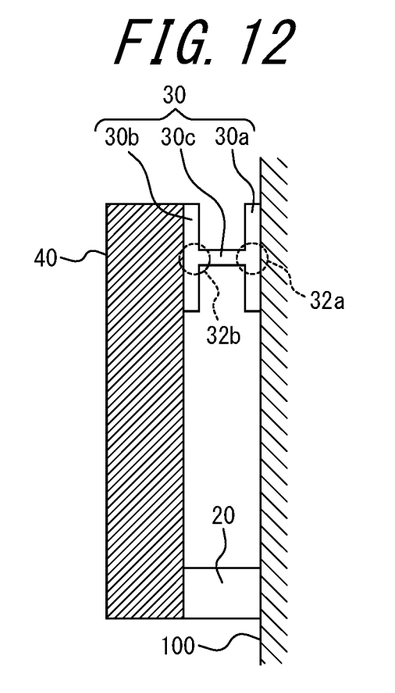
FIG. 12 is a cross-section of a tactile sensation providing apparatus according to another embodiment.

A tactile sensation providing apparatus 10 according to another embodiment may include a holding member 30 like the one illustrated in FIG. 12. The holding member 30 illustrated in FIG. 12 may have an H-shaped cross-section. The holding member 30 may include a first part 30a, a second part 30b, and a third part 30c. The third part 30c may be connected to the first part 30a at one end and connected to the second part 30b at the other end. The holding member 30 may be attached to the attachment target 100 at the first part 30a. The holding member 30 may hold the vibration target 40 with the second part 30b at the surface of the vibration target 40 that faces the attachment target 100. The holding member 30 may be configured so that the vibration target 40 is rotatable with the portion connecting the first part 30a and the third part 30c as a first fulcrum 32a. The holding member 30 may be configured so that the vibration target 40 is rotatable with the portion connecting the second part 30b and the third part 30c as a second fulcrum 32b.

Although embodiments of the present disclosure have been described through drawings and examples, it is to be noted that various changes and modifications will be apparent to those skilled in the art on the basis of the present disclosure. Therefore, such changes and modifications are to be understood as included within the scope of the present disclosure.

The references to "first", "second", and the like in the present disclosure are identifiers for distinguishing between the corresponding elements. The numbers of elements distinguished by references to "first", "second", and the like in the present disclosure may be switched. For example, the identifiers "first" and "second" of the first fulcrum 32a and the second fulcrum 32b may be switched. Identifiers are switched simultaneously, and the elements are still distinguished between after identifiers are switched. The identifiers may be removed. Elements from which the identifiers are removed are distinguished by their reference sign. Identifiers in the present disclosure, such as "first" and "second", may not be used in isolation as an interpretation of the order of elements or as the basis for the existence of the identifier with a lower number.

The invention claimed is:

1. A tactile sensation providing apparatus comprising:
   an actuator configured to vibrate a vibration target; and
   a holding member configured to hold the vibration target;
   wherein the holding member is disposed apart from the actuator; and
   wherein the actuator rotates the vibration target with the holding member as a fulcrum, the fulcrum is positioned a spaced distance from a center area of the vibration target.

2. The tactile sensation providing apparatus of claim 1, wherein the actuator rotates the vibration target within a predetermined angular range.

3. The tactile sensation providing apparatus of claim 1, wherein the holding member comprises an elastic modulus as the fulcrum.

4. The tactile sensation providing apparatus of claim 3, wherein the elastic modulus is adjcent the vibration target.

5. The tactile sensation providing apparatus of claim 3, wherein the elastic modulus is adjacent an attachment target to which at least one of the actuator and the holding member are attached.

6. The tactile sensation providing apparatus of claim 1, wherein the holding member is U-shaped in a cross section, with at least one elastic modules portion serving as the fulcrum.

7. The tactile sensation providing apparatus of claim 1, wherein the holding member is T-shaped in a cross section, with at least one elastic modules portion serving as the fulcrum.

8. The tactile sensation providing apparatus of claim 1, wherein the holding member is H-shaped in a cross section, with at least one elastic modules portion serving as the fulcrum.

9. The tactile sensation providing apparatus of claim 1, wherein the holding member is rubber, resin, metal, or ceramic.

10. A device providing haptic feedback, comprising:
    a vibration target having a tactile sensation surface and an attachment surface, the attachment surface having a first area separated from a second area by a center area of the attachment surface;
    a holding member having a fulcrum part rotatable in a first direction, and attached to the vibration target at the first area of the attachment surface; and
    an actuator in contact with the vibration target at the second area of the attachment surface;
    wherein when pressure is applied to the tactile sensation surface, the actuator engages to rotate the vibration target and the fulcrum part in the first direction.

11. The device of claim 10, wherein the actuator rotates the vibration target within a predetermined angular range.

12. The tactile sensation providing apparatus of claim 1, wherein the holding member comprises a deformable fulcrum.

13. The device providing haptic feedback of claim 10, wherein the holding member comprises a deformable fulcrum part.

14. The tactile sensation providing apparatus according to claim 1, wherein the holding member further comprises:
    a first portion attached to a housing of a device provided with the tactile sensation providing apparatus;
    a second portion attached to a surface opposing to the vibration target;
    a third portion connecting between the first portion and the second portion;
    a first fulcrum separating the first portion and the third portion; and
    a second fulcrum separating the second portion and the third portion.

15. The tactile sensation providing apparatus according to claim 14, wherein the vibration target rotates with at least one of the first fulcrum and the second fulcrum as the fulcrum.

* * * * *